United States Patent
Yamazaki

(10) Patent No.: US 7,604,042 B2
(45) Date of Patent: Oct. 20, 2009

(54) COOLING MECHANISM WITH COOLANT, AND TREATMENT DEVICE WITH COOLING MECHANISM

(75) Inventor: Koichi Yamazaki, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 10/477,632

(22) PCT Filed: May 17, 2002

(86) PCT No.: PCT/JP02/04808

§ 371 (c)(1), (2), (4) Date: Nov. 14, 2003

(87) PCT Pub. No.: WO02/095086

PCT Pub. Date: Nov. 28, 2002

(65) Prior Publication Data

US 2004/0129224 A1    Jul. 8, 2004

(30) Foreign Application Priority Data

May 18, 2001  (JP)  ............................. 2001-150101

(51) Int. Cl.
*F28F 7/00* (2006.01)
*F28F 27/02* (2006.01)
*C23C 16/00* (2006.01)

(52) U.S. Cl. ...................... 165/80.4; 165/103

(58) Field of Classification Search .............. 165/80.4, 165/104.33, 56, 65, 96, 100, 101, 103; 118/724, 118/725; 156/345.27, 345.34, 345.37, 345.52, 156/345.53

See application file for complete search history.

(56) References Cited

U.S. PATENT DOCUMENTS 3,756,903 A * 9/1973 Jones .......................... 165/274

(Continued)

FOREIGN PATENT DOCUMENTS

JP          10-116822          5/1998

(Continued)

OTHER PUBLICATIONS

International Preliminary Examination Report (PCT/IPEA/409) (translated) issued for PCT/JP02/04808, 2002.

(Continued)

*Primary Examiner*—Tho V Duong
(74) *Attorney, Agent, or Firm*—Smith, Gambrell & Russell, LLP

(57) ABSTRACT

A processing apparatus is provided with a showerhead for introducing a process gas into a processing vessel, and heaters for heating the showerhead to an elevated temperature. The processing apparatus is provided with a main flow line for a cooling liquid, and a bypass flow line connected to the main flow line so as to bypass the showerhead. A cooling liquid control system for controlling the flow of the cooling liquid includes shutoff valves, and a valve controller. The cooling liquid control system controls the flow of the cooling liquid such that the cooling liquid is prevented from flowing through the cooling passage while the showerhead is being heated to the elevated temperature, and such that the cooling liquid is made to flow through both the cooling passage and the bypass flow line while the showerhead is being cooled to a reduced temperature.

5 Claims, 3 Drawing Sheets

U.S. PATENT DOCUMENTS

| | | | | |
|---|---|---|---|---|
| 5,057,968 | A | * | 10/1991 | Morrison .................... 361/700 |
| 5,226,471 | A | * | 7/1993 | Stefani ....................... 165/200 |
| 5,435,379 | A | * | 7/1995 | Moslehi et al. ............ 165/80.4 |
| 5,581,874 | A | * | 12/1996 | Aoki et al. .................... 29/825 |
| 5,653,806 | A | * | 8/1997 | Van Buskirk ............... 118/715 |
| 5,835,334 | A | * | 11/1998 | McMillin et al. ............ 361/234 |
| 5,892,207 | A | * | 4/1999 | Kawamura et al. .......... 219/492 |
| 6,135,052 | A | * | 10/2000 | Fujii et al. ............... 118/723 E |
| 6,174,408 | B1 | * | 1/2001 | Kadomura et al. ..... 156/345.27 |
| 6,273,953 | B1 | * | 8/2001 | Yeh et al. ............... 156/345.12 |
| 6,432,259 | B1 | * | 8/2002 | Noorbakhsh et al. ... 156/345.33 |

FOREIGN PATENT DOCUMENTS

| | | |
|---|---|---|
| JP | 10-317142 | 12/1998 |

OTHER PUBLICATIONS

Notification of Transmittal of Copies of Translation of the International Preliminary Examination Report (PCT/IB/338) issued for PCT/JP02/04808, 2002.

* cited by examiner

COOLING MECHANISM WITH COOLANT, AND TREATMENT DEVICE WITH COOLING MECHANISM

TECHNICAL FIELD

The present invention relates to a cooling mechanism using a cooling liquid for cooling a member heated at an elevated temperature by a heater, and a processing apparatus provided with such a cooling mechanism for processing a semiconductor wafer or the like by a process, such as a film-forming process, using a process gas.

BACKGROUND ART

Generally, a semiconductor wafer, such as a silicon substrate, is subjected to various processes including a film-forming process, an etching process, and a diffusion process to fabricate a semiconductor integrated circuit.

Some of the processes inevitably deposit a reaction byproduct on the surface of, for example, a showerhead for introducing a process gas into a processing vessel. Such a reaction byproduct produces particles during a process. The showerhead or such is heated periodically or indeterminately to remove the reaction byproduct by sublimation without opening the processing vessel into the atmosphere.

This problem will be described with reference to FIG. 3 typically showing a conventional semiconductor wafer processing apparatus. Referring to FIG. 3, the semiconductor wafer processing apparatus has a processing vessel 4 provided in its lower part with an exhaust port 2 for vacuum evacuation. A susceptor 8 provided with a resistance heater 6 is placed in the processing vessel 4. A semiconductor wafer W is mounted on the susceptor 8.

A showerhead 12 provided with a plurality of gas holes 10 is attached to the top wall 14 of the processing vessel 4. A process gas, such as a film-forming gas, is introduced through the showerhead 12 into the processing vessel 4. A showerhead resistance heater 16 is embedded in the showerhead 12 to heat the showerhead when necessary. A cooling pipe 18 is embedded in the top wall 14 to cool the showerhead 12 indirectly when necessary. A pump 20 pumps a cooling liquid C, such as cooling water, to make the cooling liquid C flow through the cooling pipe 18.

After some wafers have been processed by the processing apparatus for a process, such as a film-forming process, a sublimable reaction byproduct deposits on the surface of the showerhead 12. Then, the showerhead heater 16 is energized to heat the showerhead 12 at a temperature at which the reaction byproduct sublimates, such as about 160° C., and the showerhead 12 is kept at this temperature for a predetermined time. The temperature of the showerhead 12 is decreased to perform the regular process, such as the film-forming process, immediately after the reaction byproduct has been removed by sublimation. The cooling liquid is passed through the cooling pipe 18 to cool the showerhead 12 indirectly to a temperature at which the film-forming process can be started, such as about 60° C.

The temperature of the showerhead 12 needs to be decreased rapidly to the predetermined process temperature and the film-forming process needs to be started immediately to increase the throughput of the film-forming process. Since the showerhead 12 of the conventional wafer processing apparatus is cooled indirectly by passing the cooling liquid through the cooling pipe 18 embedded in the top wall 14 supporting the showerhead 12, it takes a long time of, for example, 20 minutes or longer, to cool the showerhead 12. Thus, the throughput of the film-forming process is reduced.

It may be possible to cool the showerhead 12 directly by embedding the cooling pipe 18 in the showerhead 12 instead of in the top wall 14. However, if the cooling pipe 18 is embedded in the showerhead 12, the cooling liquid remaining in the cooling pipe 18 will evaporate due to rapid heating and pressure in the cooling pipe 18 will sharply increase. Consequently, the sharply increased pressure acts directly to a cooling system including pipes and the pump 20 connected to the cooling pipe 18 and it is possible that the cooling system is damaged.

Thus, there has been demand for a processing apparatus provided with a cooling mechanism capable of rapidly decreasing the temperature of a member to be cooled, such as a showerhead.

DISCLOSURE OF THE INVENTION

The present invention has been made in view of the foregoing problems.

According to a first aspect of the present invention, a cooling mechanism for cooling an objective member to be heated at an elevated temperature by a heater comprises: a main flow line for a cooling liquid, including a cooling passage extending through the objective member; a bypass flow line connected to the main flow line so as to bypass the objective member; and a cooling liquid control system controlling a flow of the cooling liquid such that the cooling liquid is stopped from flowing through the cooling passage while the objective member is being heated to the elevated temperature, and the cooling liquid is flowing through both the cooling passage and the bypass flow line while the objective member is being cooled to a reduced temperature.

For example, the cooling liquid control system includes: an inlet shutoff valve placed between an upstream junction of the main flow line and the bypass flow line, and an inlet side of the cooling passage, in the main flow line; an outlet shutoff valve placed between a downstream junction of the main flow line and the bypass flow line, and an outlet side of the cooling passage, in the main flow line; a bypass shutoff valve placed in the bypass flow line; and a valve controller controlling the inlet shutoff valve, the outlet shutoff valve and the bypass shutoff valve.

Preferably, a pressure-relief valve is placed at least in either: a first part between the inlet side of the cooling passage and the inlet shutoff valve, in the main flow line; or a second part between the outlet side of the cooling passage and the outlet shutoff valve, in the main flow line.

According to a second aspect of the present invention, a processing apparatus comprises: a processing vessel for containing an object to be processed; a showerhead for introducing a process gas into the processing vessel; heater for heating the showerhead at an elevated temperature; a main flow line for a cooling liquid, including a cooling passage extending through the showerhead; a bypass flow line connected to the main flow line so as to bypass the showerhead; and a cooling liquid control system controlling a flow of the cooling liquid such that the cooling liquid is stopped from flowing through the cooling passage while the showerhead is being heated to the elevated temperature, and the cooling liquid is flowing through both the cooling passage and the bypass flow line while the showerhead is being cooled to a reduced temperature.

Preferably, the bypass flow line is thermally isolated from the showerhead.

BEST MODE FOR CARRYING OUT THE INVENTION

A processing apparatus with a cooling mechanism, in a preferred embodiment according to the present invention will be described as applied to forming a film on a semiconductor wafer will be described with reference to the accompanying drawings.

Figure 1:
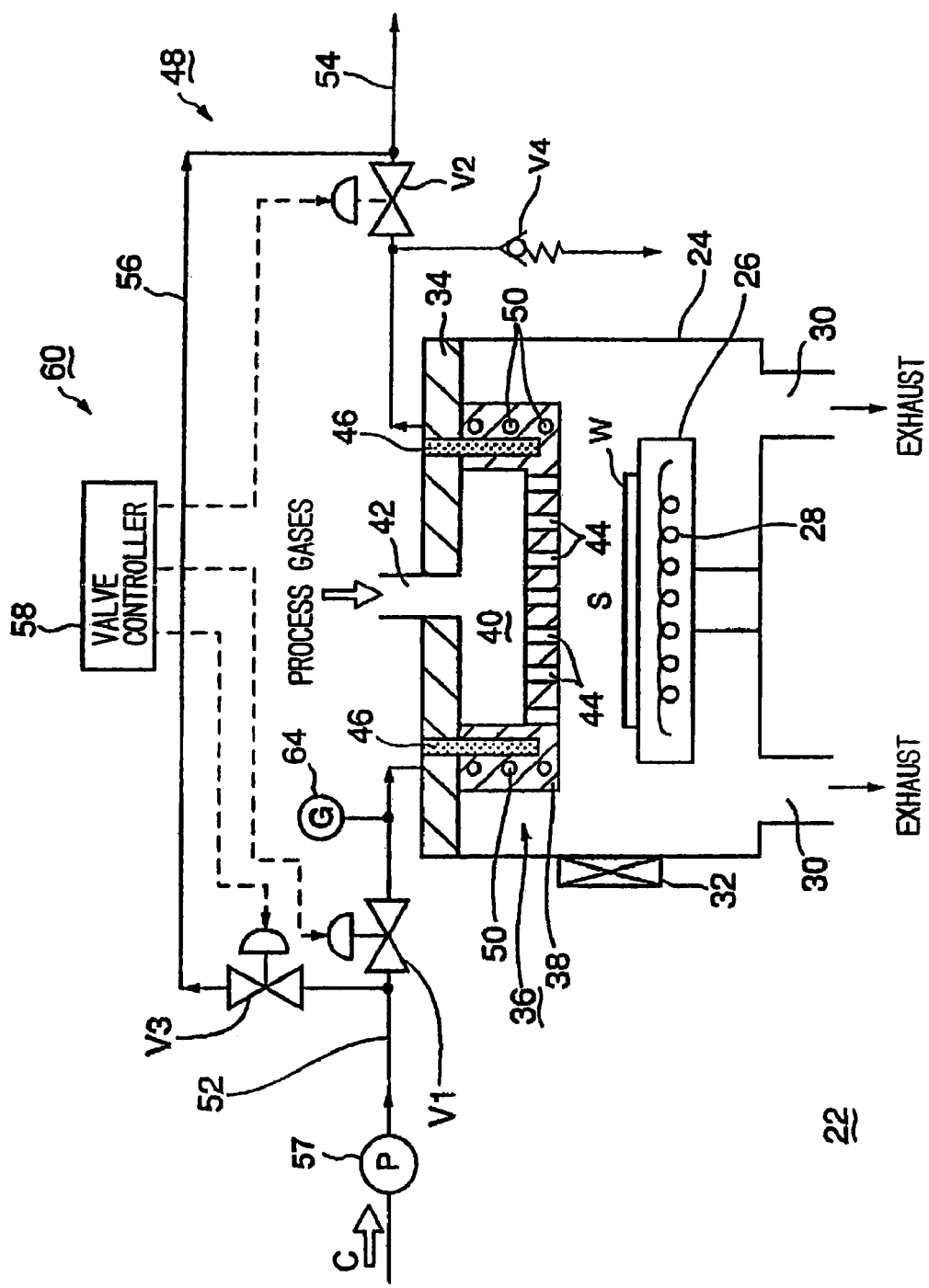
FIG. 1 is a typical view of a processing apparatus with a cooling mechanism, in a preferred embodiment according to the present invention.

Referring to FIG. 1, a processing apparatus 22 has a cylindrical processing vessel 24 formed of, for example, aluminum. A susceptor 26 for supporting a semiconductor wafer W, i.e. an object to be processed, thereon is set in a lower part of the interior of the processing vessel 24. The susceptor 26 is provided with a built-in resistance heater 28 for heating the wafer W supported on the susceptor 26. Heating lamps may be used instead of the resistance heater 28.

The processing vessel 24 is provided with an exhaust port 30 in its lower part. An evacuation system including a vacuum pump and such is connected to the exhaust port 30. The evacuation system is capable of evacuating the processing vessel 24. A gate valve 32 is set on the sidewall of the processing vessel 24. The semiconductor wafer W is carried into and carried out of the processing vessel 24 through the gate valve 32.

A detachable top wall 34 formed of, for example, aluminum is attached to the upper end of the processing vessel 24 to seal the processing vessel 24. A showerhead 36 is attached to the lower surface of the top wall 34. Process gases are supplied through the showerhead 36 into the processing vessel 24. The showerhead 36 has a showerhead body 38 formed of, for example, aluminum, in the shape of a short cylinder. The showerhead body 38 defines a gas diffusion chamber 40. Gas inlets 42 for different types of process gases are formed in the top wall 34 so as to open into the gas diffusion chamber 40. Predetermined process gases are supplied through the gas inlets 42 into the gas diffusion chamber 40.

The bottom wall, facing the susceptor 26, of the showerhead body 38 is provided with a plurality of gas holes 44. The gas diffusion chamber 40 communicates with a processing space S by means of the gas holes 44. A diffusion plate provided with diffusion holes may be placed in the gas diffusion chamber 40 to disperse gases.

A plurality of bar-shaped resistance showerhead heaters 46, i.e. heaters for heating the showerhead 36 at an elevated temperature, are embedded at predetermined angular intervals in the side wall of the showerhead body 38. The showerhead heaters 46 are extended substantially vertically in the sidewall of the showerhead body 38 and through the top wall 34. The showerhead heaters 46 are capable of directly heating the showerhead body 38 when necessary. Sheathed heaters may be embedded in a circular arrangement in the showerhead 38 instead of the bar-shaped heaters 46.

A cooling mechanism 48 characteristic of the present invention is combined with the showerhead 36. The cooling mechanism 48 has a helical cooling passage 50 helically extending in the sidewall of the showerhead body 38. An inlet line 52 and an outlet line 54 are connected to the inlet side and the outlet side, respectively, of the cooling passage 50 formed in the showerhead 36. The inlet line 52 and the outlet line 54 form a main flow line for a cooling liquid. The cooling liquid may be cooling water. The lines 52 and 54 are provided with an inlet shutoff valve V1 and an outlet shutoff valve V2, respectively. A water supply pump 57 for pumping cooling water is placed in the inlet line 52.

A bypass flow line 56 is connected to the main flow line so as to bypass the cooling passage 50 formed in the showerhead 36. The bypass flow line 56 is thermally isolated from the showerhead 36. More concretely, the bypass flow line 56 has one end connected to a part, between the inlet shutoff valve V1 and the water supply pump 57, of the inlet line 52 to form an upstream junction; and the other end connected to a part, on the outlet of the outlet shutoff valve V2, of the outlet line 54 to form a downstream junction. A bypass shutoff valve V3 is placed in an upstream part of the bypass flow line 56. The shutoff valves V1 to V3, and a valve controller 58 for controlling the shutoff valves V1 to V3 form a cooling liquid control system 60. The cooling liquid control system 60 controls the flow of the cooling liquid such that the cooling liquid is stopped from flowing through the cooling passage 50 while the showerhead 36 is being heated to the elevated temperature by the showerhead heaters 46, and the cooling liquid is flowing through both the cooling passage 50 and the bypass passage 56 while the showerhead 36 is being cooled to a reduced temperature.

A pressure-relief valve V4 is placed in a branch pipe branching from a part, between the outlet side of the cooling passage 50 and the outlet shutoff valve V2, of the outlet line 54. The pressure-relief valve V4 relieves pressure in the cooling passage 50 beyond a set pressure when the showerhead 36 is being heated. The set pressure at which the relief valve V4 opens is higher than a line pressure of the cooling water pumped by the pump 57. For example, the set pressure is on the order of 2 kg/cm$^2$. A pressure-relief valve may be placed in a part, between the inlet side of the cooling passage 50 and the inlet shutoff valve V1, in the inlet line 52 instead of or in addition to placing the pressure-relief valve V4.

A pressure gage 64 is connected to a part, between the inlet side of the cooling passage 50 and the inlet shutoff valve V1, of the inlet line 52 to monitor the pressure in the cooling passage 50.

Figure 2:
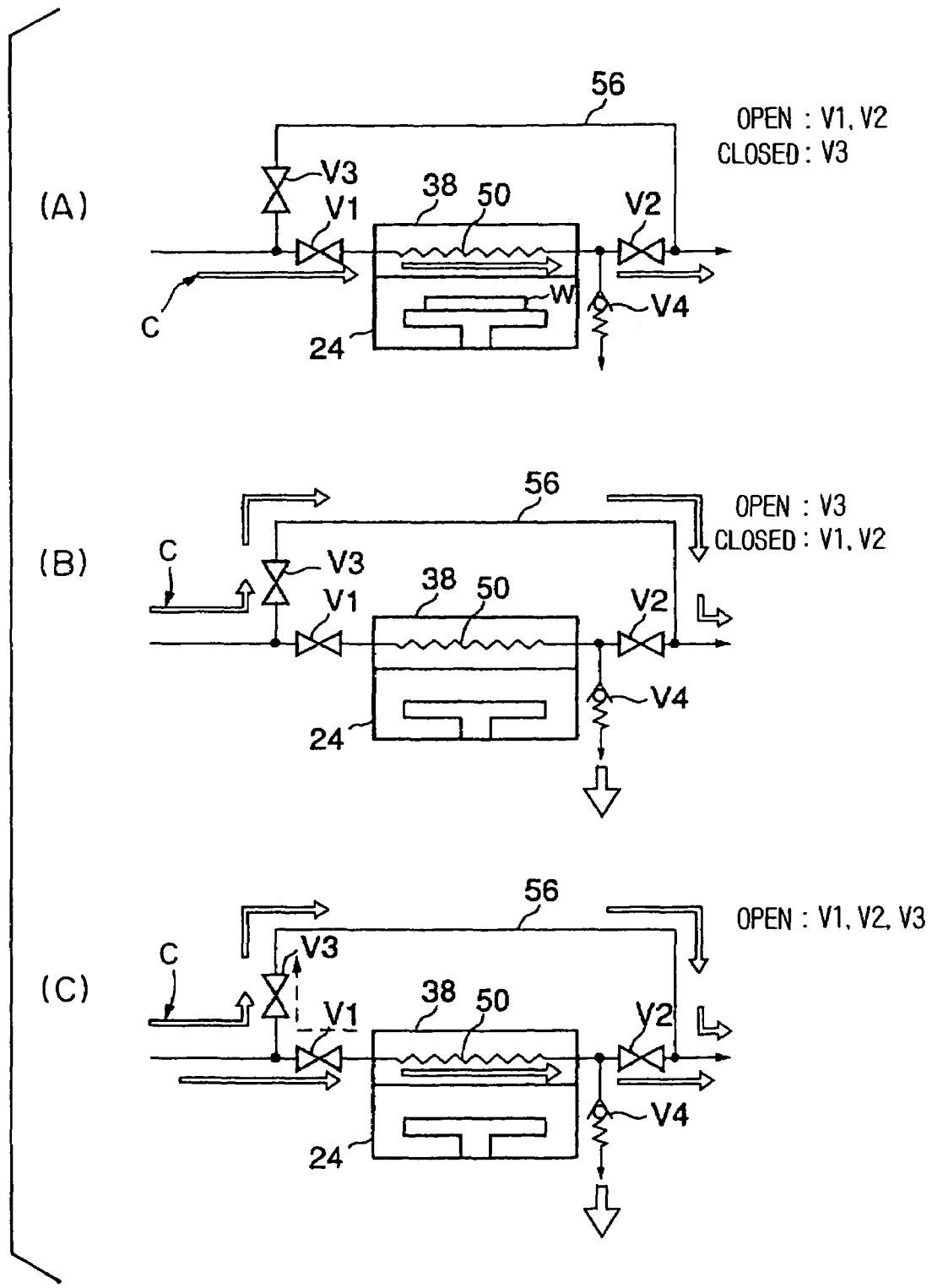
FIG. 2 is a schematic, typical view of the processing apparatus shown in FIG. 1, in a state (A) for a normal processing operation, in a state (B) for a showerhead heating operation, and in a state (C) for a showerhead cooling operation, respectively.
Figure 3:
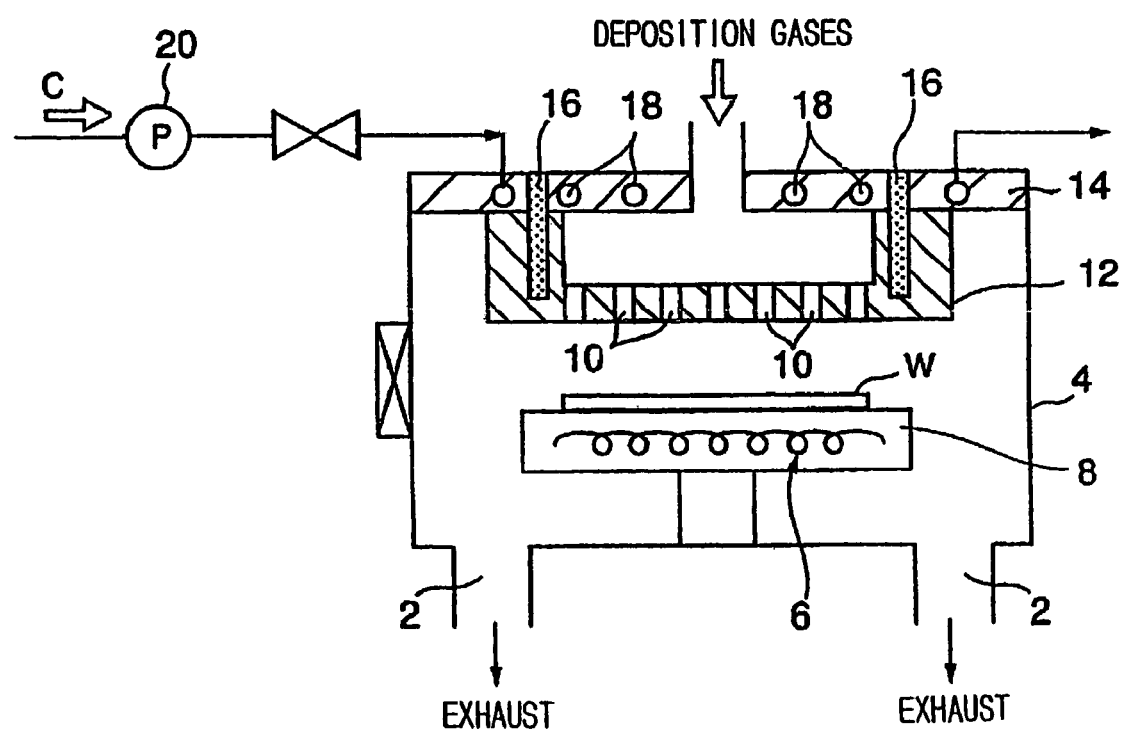
FIG. 3 is a typical view of a conventional processing apparatus with a cooling mechanism.

The operation of the processing apparatus embodying the present invention will be described with reference to FIG. 2.

A wafer W is mounted on the susceptor 26 placed in the processing vessel 24 for a regular processing operation. The heater 28 heats the waver W supported on the susceptor 26 to keep the wafer W at a predetermined processing temperature. The predetermined process gases are supplied through the showerhead 36 into the processing vessel 24 and, at the same time the atmosphere in the processing vessel 24 is evacuated to keep the interior thereof at a predetermined processing pressure during the processing operation.

Suppose that the wafer W is subjected to a film-forming process to deposit a tungsten film on the wafer W. Then, $WF_6$ gas, and $SiH_4$ gas, $H_2$ gas, Ar gas, $N_2$ gas and the like are used as the process gases, the processing temperature of the wafer W is in the range of about 410° C. to about 450° C., and the processing pressure is in the range of about 10,666 to about 40,000 Pa.

During the film-forming process as the regular processing operation, the cooling water C flows through the cooling passage 50 of the showerhead body 38 as shown in FIG. 2(A) to maintain the showerhead body 38 at a fixed temperature on the order of 60° C. Such cooling of the showerhead body 38 makes the deposition of a reaction byproduct on the showerhead body 38 difficult and ensures the stability of the film-forming process. During the film-forming process, the inlet shutoff valve V1 and the outlet shutoff valve V2 are kept opened, and the bypass shutoff valve V3 is kept closed to stop introducing the cooling water C into the bypass passage 56.

The reaction byproduct deposits gradually on the lower surface of the showerhead body 38 as the film-forming process is continued for some number of wafers. Finally, the amount of the deposited reaction byproduct reaches a maximum amount that requires the removal of the deposited reaction byproduct to prevent the generation of particles A byproduct-removing operation is performed periodically, for example, after a predetermined number of wafers have been processed, or indeterminately. The showerhead body 38 is heated to the elevated temperature above a sublimation point of the reaction byproduct to remove the deposited reaction byproduct. If the reaction byproduct is $TiF_x$ (x is a positive integer), the reaction byproduct can easily be removed by heating the showerhead body 38 at a temperature on the order of 160° C.

The inlet shutoff valve V1 and the outlet shutoff valve V3 are closed as shown in FIG. 2(B) to stop the cooling water C from flowing through the cooling passage 50 while the showerhead body 38 is being heated to the elevated temperature. At the same time, the bypass shutoff valve V3 is opened to pass the cooling water C through the bypass flow line 56 bypassing the cooling passage 50 of the showerhead body 38, and the showerhead heaters 46 (FIG. 1) embedded in the showerhead body 38 are energized by sufficient power to heat the showerhead body 38 at the elevated temperature above the sublimation point of the byproduct, such as 160° C. The byproduct-removing operation is continued for a predetermined time to remove the reaction byproduct deposited on the lower surface of the showerhead body 38 by sublimation. Since the processing vessel 24 is evacuated by vacuum evacuation, the gas of the sublimated reaction byproduct is discharged from the processing vessel 24.

The cooling water confined in the cooling passage 50 is heated and evaporated while the showerhead body 38 is being heated to the elevated temperature, and consequently, the pressure in the cooling passage 50 rises. The pressure-relief valve V4 opens automatically and relives pressure in the cooling passage 50 upon the rise of the pressure in the cooling passage 50 beyond the set pressure to prevent the excessive rise of the pressure in the cooling passage 50.

The next film-forming process for forming a film on a wafer W is started immediately after the byproduct removing operation has been finished so ad to avoid reducing the throughput of the film-forming process. To start the film-forming process so, a showerhead-cooling operation is performed to cool the showerhead body 38 heated at the elevated temperature, for example 160° C., as rapidly as possible to the reduced temperature at which the film-forming process can be started, such as 60° C. To cool the showerhead body 38 rapidly, the bypass shutoff valve V3 is kept open, and the inlet shutoff valve V1 and the outlet shutoff valve V2 are opened as shown in FIG. 2(C). Consequently, the cooling water C flows through both the bypass flow line 56 and the cooling passage 50 to cool the showerhead body 38 rapidly.

At an initial stage of the showerhead-cooling operation, the cooling water introduced into the cooling passage 50 of the showerhead body 38 heated at the elevated temperature of, for example 160° C., is heated sharply and evaporated to generate steam. Consequently, the pressure in the cooling passage 50 rises sharply and urges the cooling water C to flow both upstream and downstream.

Since the bypass flow line 56 is open, the steam and the cooling water C urged by the sharply increased pressure flow into the bypass flow line 56. The cooling water C flowing through the bypass flow line 56 cools and condenses the steam efficiently and thereby the pressure in the cooling passage 50 is reduced. Thus, the bypass flow line 56 relieves the pressure to prevent the pressure in the cooling passage 56 from rising excessively. Since the pressure of the steam acting in an upstream direction is reduced in the cooling passage 50, the flow of the cooling water C in the cooling passage 50 is hardly stopped and hence the showerhead body 38 can rapidly be cooled to the predetermined reduced temperature.

Naturally, the pressure-relief valve V4 opens as mentioned in connection with FIG. 2(B) if the pressure in the cooling passage rises excessively during the showerhead-cooling operation.

Thus, the temperature of the showerhead body 38 can rapidly be reduced without damaging the cooling system. Since the film-forming process can be started immediately after the byproduct removing operation has been finished, the throughput of the film-forming process can be improved.

Practically, the cooling mechanism of the conventional processing apparatus took about 20 minutes to cool the showerhead from 160° C. to 60° C., while the cooling mechanism of the processing apparatus of the present invention took only about 3 minutes to cool the showerhead likewise, which proved that the cooling mechanism of the present invention, as compared with the cooling mechanism of the conventional processing apparatus, is capable of cooling the showerhead very rapidly without damaging the cooling system.

The processing temperature and the sublimation point of the reaction byproduct mentioned in the foregoing description of the preferred embodiment are only examples, and it goes without saying that the processing temperature and the sublimation point are not limited thereto. An inert fluorine fluid, such as Fluorinert™, or an ethylene glycol aqueous solution may be used instead of cooling water as a cooling liquid. Although the invention has been described as applied to the cooling mechanism of the film-forming apparatus for carrying out the film-forming process, the present invention is not limited thereto in its practical application. The present invention is applicable to optional processing apparatuses, such as plasma-assisted processing apparatuses, provided with a cooling mechanism using a cooling liquid for cooling an objective member, such as a susceptor, to be heated at an elevated temperature by a heater. The object to be processed is not limited to a semiconductor wafer, but may be an LCD substrate, a glass substrate or the like.

The invention claimed is:

1. A cooling mechanism for cooling an objective member heatable to an elevated temperature by a heater, said cooling mechanism comprising:
   a main flow line for a cooling liquid, including a cooling passage extending through the objective member;
   a bypass flow line connected to the main flow line so as to bypass the objective member; and
   a cooling liquid control system controlling a flow of the cooling liquid such that:

(i) the cooling liquid is caused to flow through only the bypass flow line while the objective member is being heated to the elevated temperature, and
(ii) the cooling liquid is caused to flow through both the cooling passage and the bypass flow line while the objective member is being cooled to a reduced temperature, wherein the cooling liquid control system includes:
an inlet shutoff valve placed between an upstream junction of the main flow line and the bypass flow line, and an inlet side of the cooling passage, in the main flow line;
an outlet shutoff valve placed between a downstream junction of the main flow line and the bypass flow line, and an outlet side of the cooling passage, in the main flow line;
a bypass shutoff valve placed in the bypass flow line; and
a valve controller controlling the inlet shutoff valve, the outlet shutoff valve and the bypass shutoff valve.

2. The cooling mechanism according to claim 1, wherein a pressure-relief valve is placed at least in either:
a first part between the inlet side of the cooling passage and the inlet shutoff valve, in the main flow line; or
a second part between the outlet side of the cooling passage and the outlet shutoff valve, in the main flow line.

3. A processing apparatus comprising:
a processing vessel for containing an object to be processed;
a showerhead for introducing a process gas into the processing vessel;
a heater for heating the showerhead to an elevated temperature;
a main flow line for a cooling liquid, including a cooling passage extending through the showerhead;
a bypass flow line connected to the main flow line so as to bypass the showerhead; and
a cooling liquid control system controlling a flow of the cooling liquid such that:
(i) the cooling liquid is caused to flow through only the bypass flow line while the showerhead is being heated to the elevated temperature, and
(ii) the cooling liquid is caused to flow through both the cooling passage and the bypass flow line while the showerhead is being cooled to a reduced temperature,
wherein the cooling liquid control system includes:
an inlet shutoff valve placed between an upstream junction of the main flow line and the bypass flow line, and an inlet side of the cooling passage, in the main flow line;
an outlet shutoff valve placed between a downstream junction of the main flow line and the bypass flow line, and an outlet side of the cooling passage, in the main flow line;
a bypass shutoff valve placed in the bypass flow line; and
a valve controller controlling the inlet shutoff valve, the outlet shutoff valve and the bypass shutoff valve.

4. The processing apparatus according to claim 3, wherein a pressure-relief valve is placed at least in either:
a first part between the inlet side of the cooling passage and the inlet shutoff valve, in the main flow line; or
a second part between the outlet side of the cooling passage and the outlet shutoff valve, in the main flow line.

5. A processing apparatus according to claim 3, wherein the bypass flow line is thermally isolated from the showerhead.

* * * * *